(12) United States Patent
Mok et al.

(10) Patent No.: US 7,554,084 B2
(45) Date of Patent: Jun. 30, 2009

(54) AUTOMATED DISPENSER

(75) Inventors: Kin Lun Mok, Hong Kong (CN); King Lung Mok, Hong Kong (CN); Hong Ng, Hong Kong (CN)

(73) Assignee: SCA Hygiene Products AB, Gothenburg (SE)

( * ) Notice: Subject to any disclaimer, the term of this patent is extended or adjusted under 35 U.S.C. 154(b) by 0 days.

(21) Appl. No.: 11/971,465

(22) Filed: Jan. 9, 2008

(65) Prior Publication Data

US 2008/0169301 A1 Jul. 17, 2008

Related U.S. Application Data

(63) Continuation of application No. PCT/EP2005/007617, filed on Jul. 13, 2005.

(51) Int. Cl.
*G01J 5/00* (2006.01)
(52) U.S. Cl. .................................. 250/338.1
(58) Field of Classification Search ............... 250/338.1
See application file for complete search history.

(56) References Cited

U.S. PATENT DOCUMENTS

| | | | |
|---|---|---|---|
| 4,467,251 A | 8/1984 | Jonsson | |
| 4,742,583 A | 5/1988 | Yoshida et al. | |
| 5,339,070 A * | 8/1994 | Yalowitz et al. | 340/578 |
| 5,375,785 A | 12/1994 | Boone et al. | |
| 5,526,973 A | 6/1996 | Boone et al. | |
| 5,772,291 A | 6/1998 | Byrd et al. | |
| 6,069,354 A * | 5/2000 | Alfano et al. | 250/221 |
| 6,695,246 B1 | 2/2004 | Elliott et al. | |
| 6,710,606 B2 | 3/2004 | Morris | |
| 6,736,348 B1 | 5/2004 | Formon et al. | |
| 6,830,210 B2 | 12/2004 | Formon et al. | |
| 6,871,815 B2 | 3/2005 | Moody et al. | |
| 6,903,654 B2 | 6/2005 | Hansen et al. | |
| 6,988,689 B2 | 1/2006 | Thomas et al. | |
| 7,017,856 B2 | 3/2006 | Moody et al. | |
| 7,114,677 B2 | 10/2006 | Formon et al. | |
| 7,182,289 B2 | 2/2007 | Moody et al. | |
| 7,191,977 B2 | 3/2007 | Denen et al. | |
| 7,237,744 B2 | 7/2007 | Morris et al. | |
| 7,296,765 B2 | 11/2007 | Rodrian | |

(Continued)

FOREIGN PATENT DOCUMENTS

DE 196 39 285 C1 4/1998

(Continued)

OTHER PUBLICATIONS

International Search Report of PCT/EP2005/007617 filed Jul. 13, 2005, date of mailing Jun. 9, 2006.

*Primary Examiner*—David P Porta
*Assistant Examiner*—Shun Lee
(74) *Attorney, Agent, or Firm*—Young & Thompson

(57) ABSTRACT

An automatic dispenser for dispensing lengths of paper for use as hand towels, includes an IR sensor system for detecting a user. The sensor system scans at a first scanning rate and also at a second higher scanning rate. When the sensor system detects a user, it changes the scanning rate from the first to the second rate. The dispenser aims at reducing power consumption while providing improved reaction time when required to dispense paper.

34 Claims, 6 Drawing Sheets

U.S. PATENT DOCUMENTS

| | | |
|---|---|---|
| 7,341,170 B2 | 3/2008 | Boone |
| 7,387,274 B2 | 6/2008 | Moody et al. |
| 2002/0109034 A1 | 8/2002 | Moody et al. |
| 2003/0169046 A1 | 9/2003 | Morris |
| 2004/0246031 A1* | 12/2004 | Lourens et al. ............... 327/58 |
| 2005/0171634 A1 | 8/2005 | York |
| 2006/0006275 A1 | 1/2006 | Neveu |
| 2006/0169827 A1* | 8/2006 | Lewis et al. ................ 242/563 |
| 2006/0173576 A1 | 8/2006 | Goerg |
| 2007/0080255 A1 | 4/2007 | Witt |
| 2007/0152010 A1 | 7/2007 | Denen et al. |
| 2007/0158359 A1 | 7/2007 | Rodrian |
| 2007/0194166 A1 | 8/2007 | Reinsel |
| 2008/0011772 A1 | 1/2008 | Morris |
| 2008/0018302 A1 | 1/2008 | Reinsel |
| 2008/0078777 A1 | 4/2008 | Cittadino |
| 2008/0087758 A1 | 4/2008 | Formon |
| 2008/0099495 A1* | 5/2008 | Mok et al. .................... 221/10 |
| 2008/0099595 A1 | 5/2008 | Lewis |
| 2008/0116356 A1* | 5/2008 | Mok et al. ............... 250/208.1 |

FOREIGN PATENT DOCUMENTS

| | | |
|---|---|---|
| DE | 19639285 C1 * | 4/1998 |
| EP | 0 880 331 | 10/2004 |
| EP | 1 501 193 A1 | 1/2005 |
| EP | 1 716 800 | 11/2006 |
| WO | 02/00083 | 1/2002 |
| WO | WO 2005/050253 | 6/2005 |
| WO | 2005/065509 | 7/2005 |
| WO | 2006/060047 | 6/2006 |
| WO | 2006/065515 | 6/2006 |
| WO | 2007/098419 | 8/2007 |
| WO | 2008/011460 | 1/2008 |
| WO | 2008/042382 | 4/2008 |
| WO | 2008/042962 | 4/2008 |
| WO | 2008/042964 | 4/2008 |
| WO | 2008/053383 | 5/2008 |

* cited by examiner ns and U.S. Pat. Nos.
AUTOMATED DISPENSER

CROSS REFERENCE TO RELATED APPLICATION

This is a continuation of international application PCT/EP2005/007617 filed on 13 Jul. 2005, which designated the United States of America.

FIELD OF THE INVENTION

The present invention relates generally to a dispenser, in particular of the type including a motor-driven dispensing system combined with control circuitry for sensing the presence of a possible user and controlling operation of said motor to effect dispensing of material. The invention furthermore relates even more particularly to an automatic towel dispenser (preferably paper towels stored inside the dispenser housing) of the electrically powered type (particularly of the DC battery powered type, but which may also be an AC-powered type or a combination of AC and DC power types) in which paper sheets such as paper hand-towels are dispensed when the presence of said possible user is detected to fulfill the condition of being within a specified zone, without physical contact of the user with the dispenser being necessary for initiating the dispensing sequence. Such dispensers are often referred to as hands-free dispensers or touchless dispensers.

BACKGROUND OF THE INVENTION

Dispensers of the aforementioned type are known for example from US-A1-2003/0169046 and U.S. Pat. Nos. 6,695,246 B1 and 6,069,354.

In for example the dispenser according to U.S. Pat. No. 6,695,246 B1, the sensor control circuitry uses either passive infrared (IR), i.e. detection of reflected ambient IR, or active IR (both IR emission and detection) to control sensing of the presence of a possible user. In the active IR mode the presence of an object (i.e. a possible user) can be detected within a detection zone of about 12 to 24 cm from the dispenser and upon said detection operates a motor to dispense a hand towel to a user. The detection zone is kept small so that objects which are outside the detection zone do not lead to undesired and unintentional dispensing. When in the desired zone, the microprocessor controlling the motor operation only activates the motor to dispense a towel when two scans are received by the IR sensing circuitry. The microprocessor can be operated to scan at about 7 Hz (i.e. 1 scan each 0.14 seconds) by using an oscillator to turn power to the microprocessor on and off. Alternatively, it can be set to operate at a different frequency. When the motor is operating the microprocessor is kept on constantly.

US-A1-2003/0169046 discloses a dispenser in which an IR sensing system is mentioned as an alternative to capacitance detection for proximity detection. In an example of capacitance-type sensing the capacitative type sensor is connected to a microprocessor. No details are given as to where an IR sensing system, if present, would be located, nor how it would be arranged to operate. A further sensor system is included for detecting paper web in a discharge chute. This further sensor system for the paper uses the microprocessor to pulse power on/off to optical sensors. Additionally, a watch-dog timer can be used which closes down the pulsing function and resumes it again when it periodically wakes the microprocessor from sleep mode.

U.S. Pat. No. 6,069,354 discloses a dispenser using active IR which generates a square wave at about 1.2 kHz so as to emit a modulated IR signal, which is detected by reflection against a possible user to an IR detector. This document proposes using a sensor system set to sense a user between about 1.25 cm and about 30 cm distant from the dispenser.

The aforementioned documents all use sensor systems which, when active, operate at a specific scanning rate (frequency) to operate a motor to dispense a piece of towel.

The aforementioned dispensers operate by using a scanning rate (number of scan per second), which is fixed when the device is active. This rate is kept fairly high so that when a user is in a detection zone, the dispenser will not take too long to dispense. This high scanning rate means however that power is being consumed at a high level since the IR emitters and detectors need to be activated very often and these consume power when active. Using a lower scanning rate would of course save power, but the time to dispense a towel would then be longer, and when the user moves his/her hands towards the dispenser rapidly after washing, this can give the impression to the user that the device is not detecting him/her properly if a towel is not dispensed immediately.

The present invention has as one of its objects, the provision of low power consumption by the sensor system in periods when a possible/potential user (i.e. an object assumed to be a user requiring dispensing of a product such as a length of hand towel or toilet paper) is not located near enough to the dispenser, and at the same time to provide a relatively quick reaction time when a possible/potential user is near enough to the dispenser and needs a towel to be dispensed. Low power consumption is particularly important in dispensers which are entirely battery powered by one or more replaceable batteries, especially those battery systems that operate without a recharging possibility by a solar cell recharging system or other type of recharging system, as dispensers of this type are generally expected to operate for a long time (e.g. enough time to dispense 60 or more rolls of paper without requiring battery replacement).

A further object of the invention is to allow still further power saving when there are no possible users in the vicinity of the dispenser.

Still further objects of the invention will be apparent on reading this specification.

SUMMARY OF THE INVENTION

The main object of the invention is achieved by the dispenser having the features defined in the independent claim. Certain preferred features of the invention are defined in the dependent claims.

Further preferred features of the invention will be apparent to the reader of this specification.

The invention is based on the idea that the scanning rate, i.e. the number of scans performed per second, is made to vary upon the location of a user with respect to the dispenser, such that the dispenser operates at a first scanning rate (i.e. performs a scanning sequence by activating IR emitter and receiver circuits, and emitting single scanning pulses at a first number of single scans per second) when no possible/potential user is detected. The system then increases the scanning rate when a user is considered to be close to the dispenser (i.e. has entered a first detection zone). This variable scanning rate allows very low power to be used when no users are adequately close to the dispenser, and only to use a higher power level when required, so that a quick reaction time to dispense a product is experienced by the user.

The invention thus provides a sensor system that creates a first detection zone which, when entered by a possible user, causes the scanning rate to change from a first lower scanning rate to a second higher scanning rate.

The first detection zone can be varied in size so as to detect a user at varying distances. For example, a remote sensor linked by either a wire connection to the dispenser or by a wireless link (e.g. IR or radio) to the dispenser can be used to detect a user entering a washroom and thus can cause the first scanning rate to change to the second scanning rate. Such a "remote" sensor could, if desired alternatively be mounted on the front-facing portion of the dispenser and can be arranged to operate at a very slow scanning rate due to the distance of the entry to a washroom from the location of the dispenser, such that by the time the possible user wishes to use a dispenser and has thus moved closer to the dispenser, the dispenser is already operating at a higher second scanning rate.

Alternatively, the same set of sensors which are used to cause the dispenser to dispense a product can also be used to detect a user entering a first detection zone and to include a control system which changes the scanning rate from the first slower rate to the second higher rate. In this way, a user approaching the dispenser (e.g. 40 to 50 cm or perhaps further away from the dispenser) will activate the sensor system to change the scanning rate to a higher scanning rate and as the user continues to move his hands and/or body closer to the discharge outlet of the dispenser, the user will be detected as being in a "dispensing zone" and will thus cause the dispenser to dispense a product (e.g. a paper hand towel).

If desired, more than two scanning rates can be used. For example a first slow scanning rate can be used (such as 1 or 2 times per second) followed by a higher second scanning rate (e.g. at 3 to 6 times per second), followed by a further higher rate (e.g. at 7 to 12 times per second), whereby the scanning rate is increased from one rate to the next as the user is detected to be moving closer to the dispenser. This can be performed by a series of different sensors for example, each detecting at different distances, or for example by using the same set of sensors detecting an increased IR signal reflection from the user as the user approaches closer to the dispenser.

When a user moves away from the dispenser, the scanning rate can then be decreased again to a lower rate, thereby consuming less sensor operation power.

As will be apparent, even at relatively short distances for the first detection zone (e.g. up to about 50 cm from the dispenser for example in a 30° to 60° slanted forwards and downwards direction) it will be understood that the system has significant power saving advantages while still allowing a good reaction time to dispense a towel. This is because the user expects to move his/her hands relatively close to the device in order for dispensing to occur, and this takes on the order of between a quarter and half a second at normal hand movement speeds (between 0.2 m/s and 0.5 m/s), by which time the dispenser can be made to be already scanning at the second higher rate (or even a still higher rate) and thus be able to dispense very close to the time when the hands are in an "expected" position for dispensing (i.e. a position at which the user would expect a towel to be dispensed, typically some 15 to 25 cm from the dispenser outlet).

Likewise, it is preferred that when using an IR sensor system, the sensor system should preferably be able to cope with singular anomalies of short term high IR reflections, as sometimes occurs, without dispensing a towel, so that it is appropriate to sense two or more consecutive scans, or e.g. a predetermined number of scans in a number of consecutive scans (e.g. two out of three consecutive scans), each being at a predetermined level of IR above background level, before dispensing a product.

Advantageous use can be made of the varied scanning rate by making the first scanning rate between e.g. 0.15 and 0.25 seconds between scans (i.e. the scanning rate when a possible user is outside the first detection zone), or even longer (such as between 0.25 and 0.5 seconds), and the second scanning rate of the order of about 0.08 to 0.12 seconds between scans and requiring only two consecutive scans (or e.g. two out of three consecutive scans) providing a reflected IR level above background IR level to activate dispensing. Such dispensing will be perceived by the user as almost immediate, yet a significant amount of power used by the sensor system can be saved due to the initial low scanning rate which consumes less power.

BRIEF DESCRIPTION OF THE DRAWINGS

The invention will now be explained in more detail with reference to certain non-limiting embodiments thereof and with the aid of the accompanying drawings, in which.

DETAILED DESCRIPTION OF THE PREFERRED EMBODIMENTS

Figure 1:
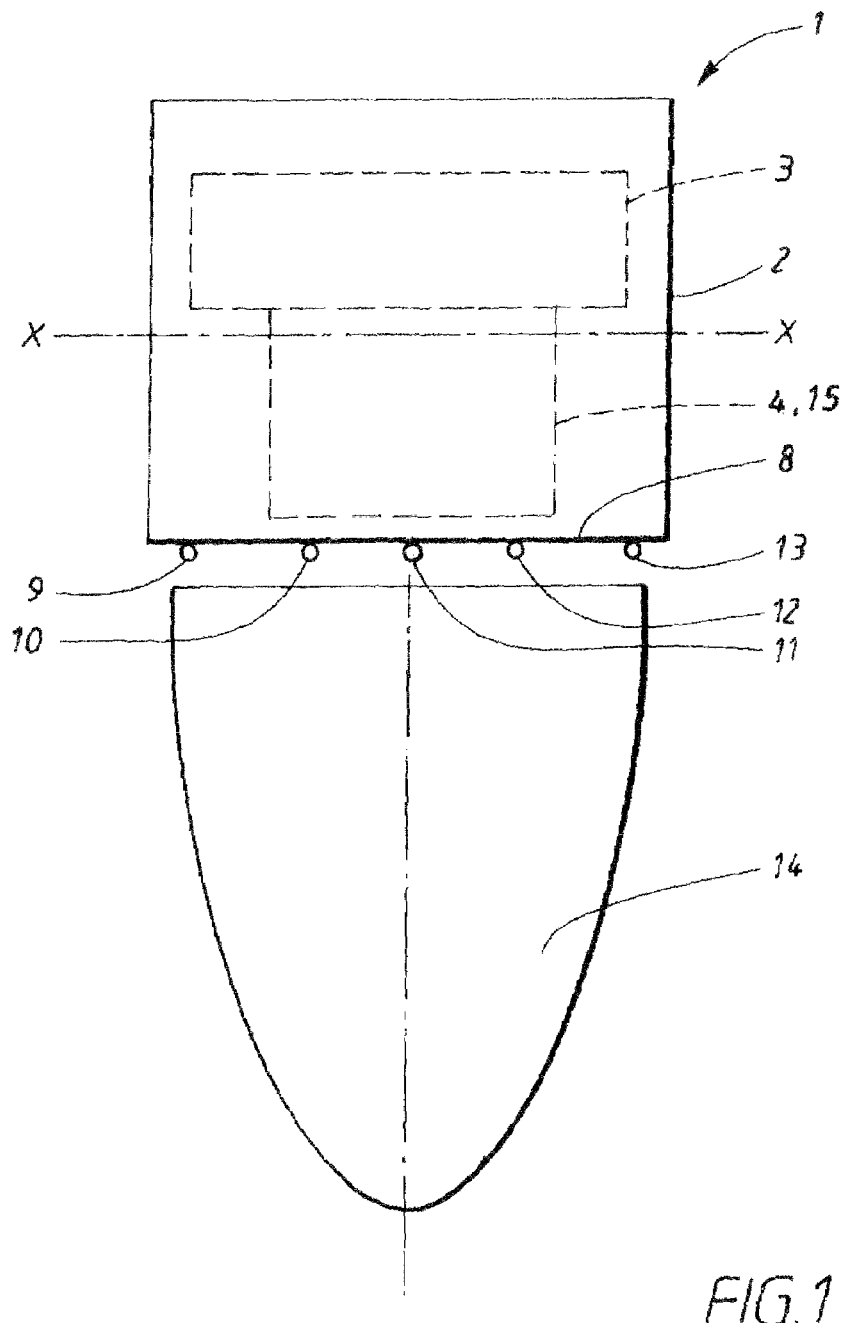
FIG. 1 shows a schematic front view of a paper towel dispenser with a paper roll and paper transport mechanism in hidden view, depicting a first detection zone.
Figure 2:
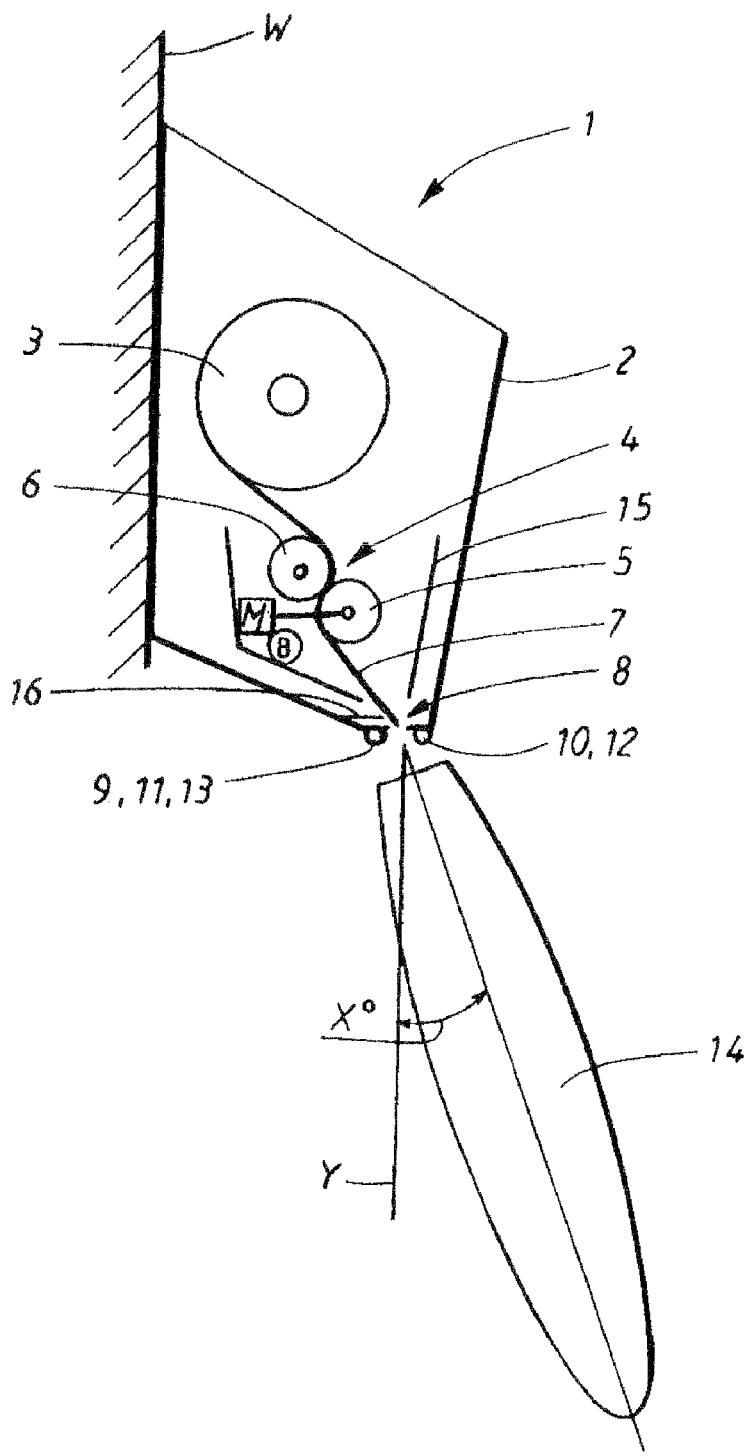
FIG. 2 shows a side view of the arrangement in FIG. 1 whereby a side panel of the dispenser has been removed to show schematically the paper roll and simplified schematic details of the paper transport mechanism.

FIG. 1 and FIG. 2 show a dispenser 1 in front and side views respectively, whereby FIG. 2 shows the dispenser 1 attached at its rear side to a wall (the means of attachment are not shown but may be of any suitable type such as screws, adhesive, adhesive tape, or other attachment means).

The dispenser 1 comprises a housing 2, within which is located a product supply, in this case a supply of paper in a roll 3. The roll is suitably a roll of continuous non-perforated paper, but may also comprise perforated paper in some cases. Also located in the housing 2 is a paper transport mechanism 4, preferably in the form of a modular drive cassette with its own casing 15, which can preferably be removed as a single unit from the housing 2 when the housing is opened.

FIG. 1 shows the paper roll 3 and the transport mechanism 4 as simple blocks for the sake of simplicity. Likewise, FIG. 2 shows the paper roll 3 and the transport mechanism 4 in a vastly simplified form, whereby the transport mechanism includes a drive roller 5 engaged with a counter roller 6, whereby a portion of the paper sheet 7 is shown located between said rollers 5, 6, with the leading edge of said paper sheet 7 ready to be dispensed at a discharge outlet 8 formed in the housing 2 at the lower side thereof.

The drive roller 5 is shown schematically connected to an electrical drive motor M powered by batteries B. A gearing, typically in a gearbox, may be included between the motor drive shaft and the drive roller 5. Suitable batteries may supply a total of 6V when new and typically four 1.5V batteries are suitable for this purpose. Exemplary of suitable types are Duracell's MN1300 batteries, whereby each battery has a capacity of 13 Ah and which can operate from full to total discharge between the range of 1.5V to 0.8V. Operation of the motor M causes drive roller 5 to rotate and to thereby pull paper sheet 7 from the paper roll 3 by pinching the paper between the nip of the rollers 5 and 6. Upon actuation, the motor rotates, thereby withdrawing paper sheet from the roll 3, which also rotates so as to allow paper to be moved towards the discharge opening 8. Other forms of drive mechanisms for withdrawing paper from a roll may also be used. The details of the paper transport mechanism or other product transport mechanism are however not important for an understanding of the invention. Such devices are also well known per se in the art.

It will also be understood from the foregoing that drive roller 5 and counter roller 6 may have their functions swapped such that the counter roller 6 could be the drive roller which is operably connected to the drive motor (and thus the drive roller 5 depicted in FIG. 2 only acts as a counter roller in contact with roller 6, normally with paper or towel in the nip therebetween).

Although the principle of operation is explained using paper in the form of a continuous paper sheet in a roll, it is to be understood that the dispenser may be used to dispense other products from a product supply, such as a continuous piece of paper in concertina format for example. Alternative products may be dispensed by the device with appropriate redesign thereof. It is also possible that other dispensing devices are tagged on to the dispenser. For example, the dispenser may further include an air freshener which is activated for example once every 5 or 10 minutes (or other suitable time) or once upon a certain number of towels dispensed. This extra tagged-on dispenser can be controlled by the dispenser control circuitry (to be described below) or by separate control circuitry (not described herein).

The motor M is at rest and without power applied to it when no paper is to be dispensed. The motor M is rotated when paper is to be dispensed through the discharge opening 8. The operation of the motor M is controlled by a master control unit (not shown in FIG. 1 and 2, but described below) connected to a sensing system comprising sensors 9-13, of which sensors 10 and 12 are emitters, preferably IR emitters, and sensors 9, 11, and 13 are IR receivers. Such IR emitters and receivers are well known in the art and typically comprise diode structures. Suitable IR emitters and receivers are for example made by Lite-ON Electronics Inc., under Type number LTE-3279K for the IR emitters and under Type number LTR-323DB for the receivers. Other types of IR emitters and receivers may also be used of course. In the shown embodiment, the IR emitters 10, 12 and IR receivers 9, 11, 13, are shown approximately equally spaced consecutively in the lateral direction X-X of the housing (generally parallel to the product supply roll 3). The spacing can suitably be about 5 cm spacing between a consecutive emitter and receiver, such that the distance between sensors 9 and 10, 10 and 11, 11 and 12, 12 and 13 are all approximately equal.

Also, the emitters and receivers are shown (see FIG. 2) placed on opposite sides of the discharge outlet 8. Other arrangements of sensors are also possible such as where all sensors are placed on the front side of the outlet in a straight row (i.e. at the location where sensors 10 and 12 are shown to be placed in FIG. 2). Sensors could also be placed on the rear side of the outlet in a straight row (e.g. where sensors 9, 11, and 13 are shown to be placed). An arrangement of sensors consecutively in a row in the order receiver/emitter/receiver/emitter/receiver allows an advantageous shape of detection zone, which is somewhat tongue-like in shape (see FIG. 1). The underlying tongue shape can be altered somewhat depending on power applied to the emitters and also their relative extent of protrusion from their housing for example.

The dispenser 1, upon detection of a possible user (the detection process being described further below) without any contact of the user needing to take place with the dispenser or the sensors, for a sufficient time in the first detection zone, thus causes the dispenser to determine that a user is present in a dispensing zone and thus to dispense a product. Dispensing is performed in this case by the front portion of the paper 7 being discharged automatically. This allows the user to grasp the paper 7 and to draw it against a cutting edge such as cutting edge 16 shown in FIG. 2, proximate the discharge opening 8, so as to remove the torn/cut-off piece of paper. The location of the cutting edge may be varied of course, such as to be at the level of, or up to 1 cm below, and opposite to the roller 5.

The first detection zone 14 as shown in FIG. 1 and 2 is shown as somewhat tongue-like and is inclined downwardly and forwardly of the discharge opening at an angle x° of preferably between 20° to 30° to the vertical axis Y, for example 27.5° As will be explained below in more detail, when a part of a possible user's body enters this first detection zone 14, the sensing system detects the user's presence and causes the sensor system to change from a first scanning rate to a second scanning rate which is higher than said first scanning rate. The sensing system also then causes the motor M to turn upon regarding a user (due to the signals received) as being present in a dispensing zone. The determination of a user being in a position requiring dispensing of a towel is explained below.

While a preferred form of the emitter/receiver arrangement is advantageous, the use of only one emitter and one receiver can also be used, or more than 2 emitters and 3 receivers. The pattern or field covered by the sensors will however vary accordingly and 2 emitters and three sensors has been found to be advantageous from the balance between the coverage area obtained and the power consumption required.

Figure 3:
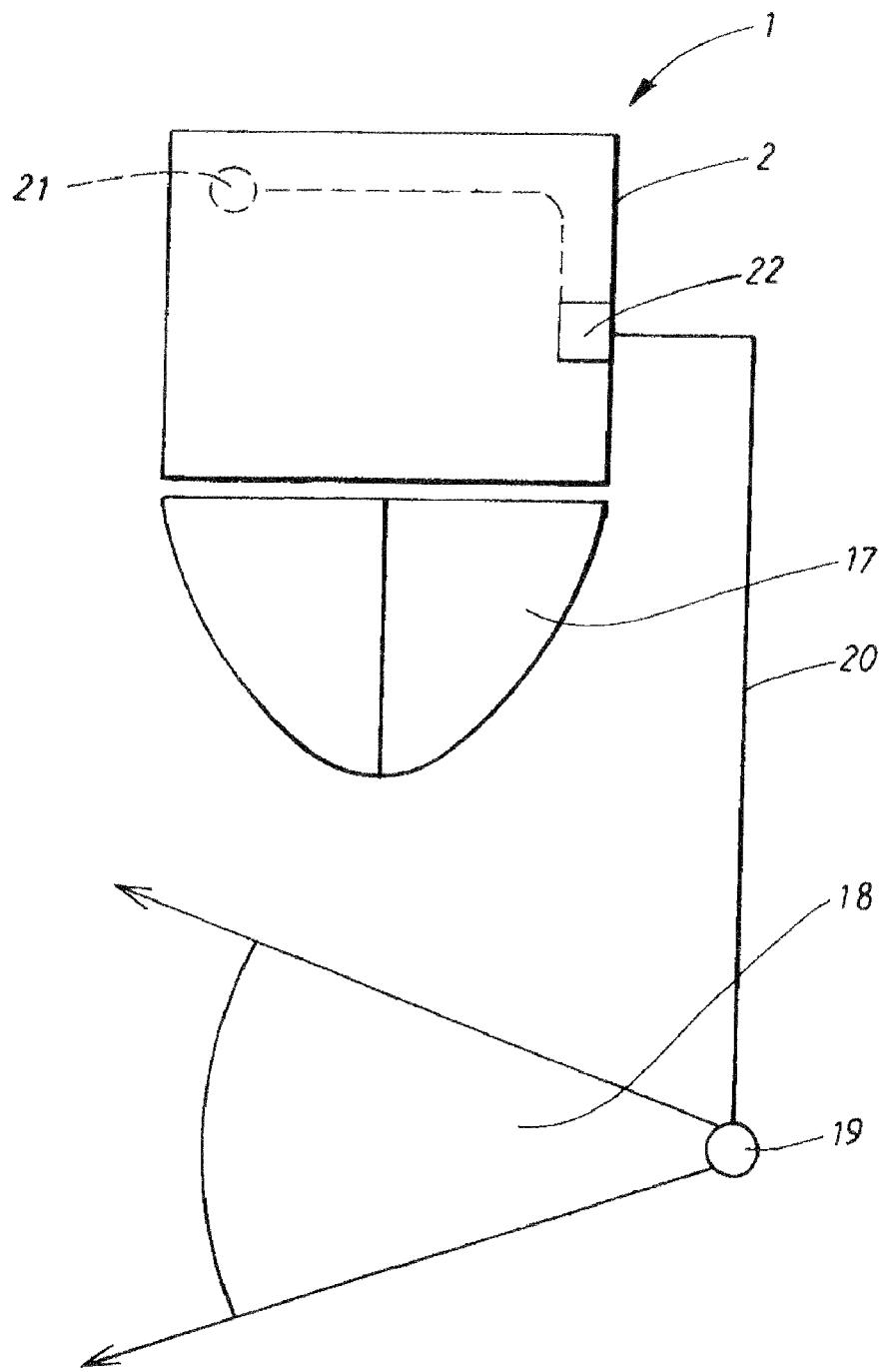
FIG. 3 shows a further embodiment of the invention with a further sensor able to detect a user at a further distance from the dispenser.

In an alternative embodiment shown in FIG. 3, a further sensor 19, remote from the dispenser housing 2 and operatively connected by wireless or wire connection 20 to the sensor system (shown schematically at 22) and its control system in the dispenser housing, may be used to form a first detection zone 18 which is further from the dispenser than the detection zone 17 (detection zone 17 in this case is similar in shape to the first detection zone 14 in FIGS. 1 and 2). Alternatively or additionally, a further sensor may be placed on the front part, e.g. a front surface, of the dispenser housing and facing forwards away from any wall or the like on which the dispenser is mounted, to allow a longer range of detection forwards of the dispenser, such as the sensor 21 shown schematically which is likewise connected to the sensor system 22. The sensor 19 and/or 21 may for example be arranged to detect the presence of possible users up to a distance of more then the first detection zone, e.g. a distance of more than 50 cm, preferably more than 100 cm, more preferably more than 200 cm and still more preferably more than 300 cm or even further from the dispenser housing 2.

The emitters 10, 12 of the sensor system are arranged via suitable control circuitry, which may control circuitry as known per se in the art, to emit pulsed IR at a narrow frequency band of about 15 kHz. Another IR frequency could however be chosen. The receivers 9, 11, 13, are arranged to detect the emitted IR which is reflected against objects (stationary or moving) back towards the receivers, In order to detect the IR which initiates primarily and almost entirely from the emitted IR even up to very strong lighting conditions (10 000 lux or more), rather than all sources and frequencies of IR radiation due to background influences, the IR receivers need to be tuned to the frequency of the emitters. Thus the IR receivers are provided with a detection circuit which suppresses IR outside the expected frequency range of the reflected waves and amplifies the IR at the 15 kHz range level. In this regard, while a frequency detection range both above and below the emitted frequency band range of between 2 to 10 kHz can operate in most situations, it has been found more suitable to use a frequency range (frequency band) which lies about 3 kHz above and also below the central frequency of the emitted IR. Thus, the receivers are tuned (or in other words "synchronized") with the emitted IR (at a central frequency of 15 kHz) by allowing IR in the range of 12 to 18 kHz to be detected (e.g. by use of a band pass filter set at 12 to 18 kHz). Frequencies outside that band are thus heavily suppressed, while the frequencies within the 12 to 18 kHz band are amplified, with maximum amplification being at the central frequency of 15 kHz, up to for example about 53 dB.

By operating with a modulated frequency in the emitters and receivers, the effects of e.g. bright sunlight which might otherwise cause saturation of the IR received signal compared to any reflected signal are substantially obviated allowing the device to work in light conditions of up to about 10000 lux background illumination.

Figure 4:
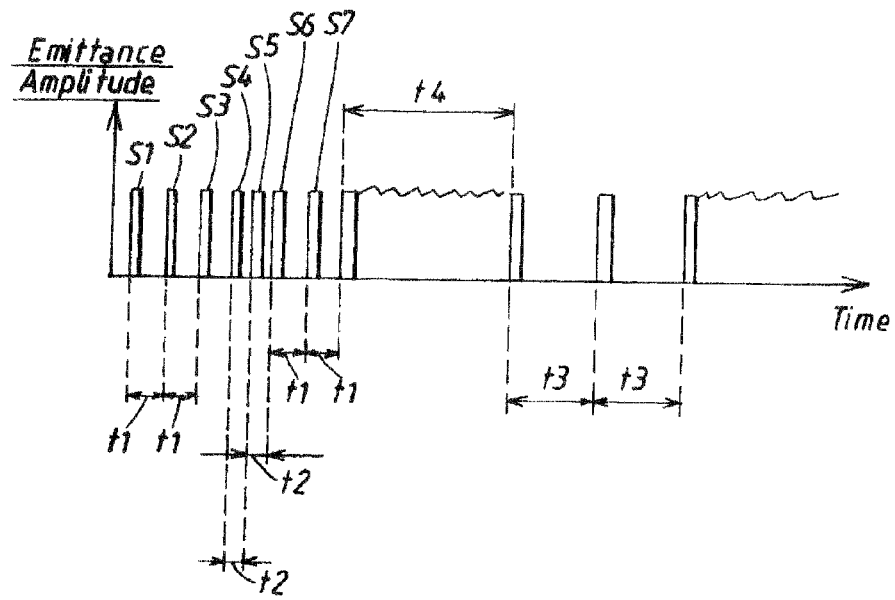
FIG. 4 shows an exemplary plot of emittance amplitude of the scanning pulses against time.

FIG. 4 shows a series of individual scans (i.e. a pulsed IR emission) at a first scanning rate having a time between individual scans of t1, a second scanning rate having a time between individual scans of t2 which is shorter than t1 (i.e. a higher scanning rate than t1) and a third scanning rate having a time between individual scan of t3 where t3 is greater than t1 and t2. The time between individual scans is measured as the time from the start of one single scan to the time of starting the next individual scan. Each of the individual scans is here shown as having the same pulse intensity (i.e. no adjustment is made between individual scans to take account of previous received reflected scans which may result in a different emittance power being supplied to the IR emitters. A further time t4 is shown which is a predetermined time or a predetermined number of pulses separated by time t1 (the first scanning rate) which needs to elapse before the system alters the scanning rate to the third, slowest scanning rate with time interval t3. The pulse width of each individual pulse is normally constant.

The time t1 is set at a constant level to lie between 0.15 to 1.0 second, preferably 0.15 to 0.4 of a second, i.e. such that each individual scan pulse is separated by an equal time t1. The time t1 can however be varied and a very suitable rate to optimize the device for battery power saving and reaction time to dispensing has been found to be about t1=0.17 seconds. The second scanning rate is always faster than the first scanning rate and t2 is set to lie preferably between 0.05 to 0.2 seconds, most preferably between 0.08 and 0.12 seconds between scans. The time t2 can however be varied to be another suitable value, but preferably lies between 30% to 70% of t1. Time t3 may be set at for example between 0.3 and 0.6 seconds, although a longer time t3 is also possible, such as 1 second or even longer. However, for emittance circuit time triggering (in particular by using an RC triggering circuit using the RC time constant to cause a discharge of current to the microprocessor for initiating timing operation), it is most suitable if t3 is set to double the length of t1. Thus, t3 may be set at 0.34 seconds in the case when t1 is 0.17 seconds. The initial time t1 can be made variable, for example via a variable resistor operated from outside the device, although typically this will be factory set so as to avoid unintentional alteration of time t1 which is unsuitable in certain situations.

Time t4 may typically be chosen to be of the order of between 30 seconds to 10 minutes and may also be variably set up in the device dependent on the type of use and surroundings which are normally encountered where the device is to be located. A suitable value for optimized operation has however been found to be about 300 seconds although may also be more, where it is desired to save further power.

Although not shown, it will be apparent that additional time periods may also be set in the device with intermediate time periods (i.e. intermediate between the values of the t1 and t2 values, or intermediate between t2 and t3 etc) or even greater time periods, dependent on operating conditions, although the use of three different scanning rates has been shown to take account of most situations with good performance in terms of reaction time and power saving. For example a further time period longer than t4, e.g. 30 minutes, occurring during issuing of scans at interval t3 could be used so as to alter the time period between scans to be longer than t3 (e.g. 10 seconds between individual scans). Such a situation may be useful when the dispenser might not hardly be used for night-time periods. The reason for this will become clearer upon reading the following description of operation.

As can be seen in FIG. 4, after four scans S1-S4 at a time interval of t1, the scanning rate changes to the second faster scanning rate with interval t2 and continues at the second scanning rate for two further scans S5 and S6. The reason for this change will be explained below with reference to FIG. 5.

Figure 5:
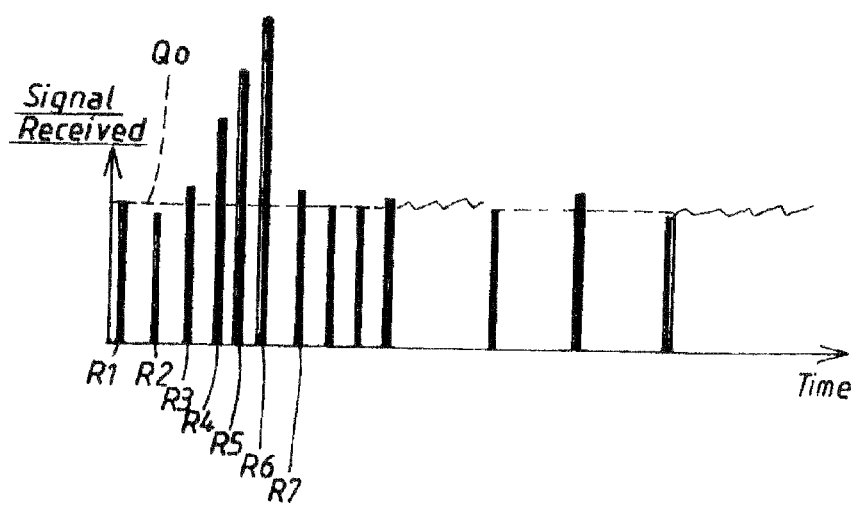
FIG. 5 shows a plot of received signal level against time, for a series of received IR reflections occurring due to the emitted IR pulses in FIG. 4.

FIG. 5 shows a sample of the possible received signal level (received signal strength) of the received signals R1-R7 caused in response to emitting the scan pulses S1-S7.

The approximate background IR level is indicated as a signal received level of Q0. This level Q0 may of course vary and as shown further below this can however be taken into account. For simplicity of explanation however, it is assumed in the following example that Q0 remains substantially constant.

When S1 is emitted and there is no object which is not accounted for in the last background value of received signal, the background level received at R1 will be approximately at level Q0. Likewise at the next scan S2 the level of IR received is also close to Q0 and thus causes no alteration of the first scanning rate. At scan S3, the received signal level R3 is however above background level, but only marginally (e.g. less than a predetermined value, for example less than 10%, above background IR level) and thus the first scanning rate is maintained. Such small changes, (below the predetermined level) above and below Q0 can occur due to temporary changes in moisture levels or persons moving at a longer distance from the dispenser, or stray IR due to changes in sunlight conditions or temperature conditions around the dispenser.

At scan S4, the received signal level has reached or surpassed the predetermined value, of e.g. 10%, above background IR and the sensor system and its control thus assumes that a possible user (e.g. the user's hands or whole body) is moving closer towards the dispenser in order to retrieve a product such as a paper towel. In order to be able to react faster when the user is assumed to wish that a towel to be dispensed (i.e. when the received signal level has reached or surpassed the predetermined value of e.g. 10% above background IR), the scanning rate thus increases to the second scanning rate and thus issues the next scanning pulse at a shorter time t2 after the previous pulse.

If the signal level R5 received on the next scan S5 also fulfils the criteria of being at, or more than, a predetermined level above background IR (e.g. at or greater than 10% above background IR in accordance with the criteria used for the previous scans), the sensor system records via a counter (e.g. in a memory or another form of register) a single detection above the predetermined level, and then issues a further scan S6 at interval t2 to check whether the received IR is still at or above the level of e.g. 10% greater than background IR Q0. As shown in FIG. 5, this is the case for scan S6, and the sensor system control (comprising both software and a microprocessor in a preferred form) then immediately issues an output to the motor M to start the motor turning in order to dispense a product (e.g. a portion of paper 7 from roll 3). In this case, i.e. when two consecutive scans are above the predetermined level, the system has thus determined that a possible user is in a zone requiring a product to be dispensed, and thus determines that the user is in a "dispensing" zone.

In the case where only one set of sensors is used to detect the presence of a user in the first detection zone (e.g. the embodiment of FIGS. 1 and 2), the detection zone and the dispensing zone will be the same physical zone, but it is merely the sensor control system which logically determines that a user has entered the dispensing zone.

In the embodiment of FIG. 3 however, where an additional sensor 19 and/or 21 is used, the signal level R4 will have been sensed in zone 18 and thus will already have caused the first scanning rate to change to the second scanning rate before the user has entered zone 17 which, in the case of FIG. 3, would be the dispensing zone which is distinct the first detection zone 18. The zones 17 and 18 could of course overlap to a lesser or greater degree, but zone 18 in such a case should always have at least a portion thereof which is arranged to extend further from the dispenser than zone 17. In such a case it is however appropriate for the second scanning rate to be maintained for a time suitable for a user to physically enter the zone 17 (e.g. a time for moving towards a wash basin, washing hands and then using a towel). Such a suitable time may be set for example between 1 and 10 minutes, during which time the second scanning rate is maintained, in the expectation of receiving IR reflected signals R which fulfill the criteria that a product is to be dispensed.

In a further situation, not shown, where the level at R5 is below the predetermined level (e.g. 10% above background IR), the system may be programmed to issue a further scan and to check again whether the received signal level is at or above the predetermined level so as to indicate that a user is present and wishes to receive a towel. Thus, rather than always requiring two consecutive scans to produce two received signals having a received signal strength above the predetermined level, it has been found preferable to allow any two of three consecutive scans to be above the predetermined level. Further possibilities also exist of course whereby the number of scans to allow dispensing of a towel could be any two out of four consecutive scans, or any three out of four consecutive scans, or further combinations. However, with t1 set at 0.17 seconds and t2 at 0.1 seconds, it has been found suitable to allow any two out of three consecutive scans to trigger dispensing of a product as this produces very reliable results.

In the case shown in FIG. 4, after a towel or other product has been dispensed (discharged), the system alters the scanning rate back to the first scanning rate so as to save power, and thus scan S7 is emitted at time t1 after scan S6. Clearly, this saves power as early as possible. However, the second scanning rate can be maintained for longer if desired (situation not depicted in FIG. 4) so that when a user again wishes to take a second or further product (e.g. a further towel) by moving their hands again towards the dispenser outlet, the dispensing occurs quickly again.

In the case shown in FIG. 5, a case is shown corresponding to FIG. 4, where the user has for example torn off a piece of paper which has been dispensed from the dispenser and thus the level of IR radiation received at R7 has moved back below the predetermined level (e.g. below a predetermined level of 10% or more above Q0).

The predetermined level above background level at which the sensor system control causes discharge of a product to occur has been described above as being 10% above background for two out of three consecutive scans. However, practical tests have shown that a more suitable level is at or above 12% greater than background IR, and even more preferably at or above 15% greater than background IR. This is for example to take account of varying light conditions which may occur when a user is close to the dispenser, but not actually wishing to use it.

However, it has also been found in testing that the increase in reflected IR which is received allows entirely different thresholds to be used where desired. Thus for example the sensor circuits can be tuned such that the predetermined level above background level is up to 90% or more, even up to 95% or more, above background IR, before dispensing occurs. This allows for example a far greater distinction of the reflection from a user's hands compared to any non-desired received IR in the pulsed bandwidth of 12 to 18 kHz (e.g. in the case of very strong light conditions). At the same time, the proximity at which such a high level occurs is generally less than when a lower predetermined level is used, unless the current to the emitters is slightly increased.

In some cases, users may move their hands very quickly towards the dispenser and may be aggravated by having to wait for a time more than absolutely necessary for the first scanning rate to alter to the second scanning rate and wait a further 0.2 seconds (when using t2=0.1), even though this in most cases is a negligible time. A further overriding control may thus be included in which any single received scan signal at or above e.g. 30% (or a higher amount, such as above 95% in the case described in the preceding paragraph) compared to background level can be used to cause immediate dispensing of a product, without requiring consecutive scans at or above a predetermined level, even when in the first (lower) scanning rate mode. This can also be made to apply in the second scanning rate mode.

After a period of inactivity for an extended time period t4, during which the sensing system has been scanning at the first rate, the system can be allowed to assume that there are no possible users in the vicinity of the dispenser. In such a case, even the time t1 may be considered too short to allow optimal power saving, and thus the system can alter the scanning rate to the third scanning rate lower than the first scanning rate, during which a scanning pulse is issued only once after elapse of time t3. However in such a case, when one IR signal is received which is at or above the predetermined level (e.g. 15% or more above background level), then the system should alter the scanning rate directly to the second higher scanning rate, rather than first adopting the original first scanning rate. However, in such a case it is appropriate to require at least two scans but preferably more scans to cause product dispensing. For example, when a washroom where the dispenser is placed is put into darkness, and then at some time later the lights are turned on, the IR received levels may be considered to determine that a user is present. To avoid a product being dispensed in such a case it may be appropriate to let the system have time to take account of the background IR levels before being allowed to dispense.

In terms of the background level of IR, as mentioned above, this will vary over time. Likewise, the presence of fixed objects (e.g. soap dishes, other containers, or other fixed objects) within the range of the dispenser need to be taken account of as background IR. In order to do this, it has been found suitable to take a moving average of the most recently recorded IR received signals R so as to alter the level Q0 on a continuous basis.

For example, the four (or more or less than four) most recently received IR signal values can be used to form the average value of background signal level by dividing e.g. the sum of the four most recent received signal levels by four. As each new value of IR is received, the oldest value of the four values is moved out of the calculation (e.g. by removing it from a register or store of most recent values in the control circuitry) and calculating a new average based on the most recent values. Calculation of a moving average and the means required to do this in both hardware and/or software for the most recently recorded set of values is very well known in the art of electronics, and thus is deemed to require no further explanation here.

By using such a moving average of background IR level, the further advantage is obtained that when a user who has just withdrawn a towel or other product keeps his/her hands at the dispensing outlet, the received IR level will remain high. However, to prevent a user in this way causing discharge of a large amount of product, e.g. paper towel material, the user's hands will be regarded as being background IR when they are relatively stationary and thus dispensing will not occur. To dispense a further product (e.g. paper), the user must therefore move his/her hands away from the dispenser sensors to allow a reading of "true" background IR (i.e. background IR without the user's hands being present too close to the device). Only upon renewed movement of the user's hands towards the dispenser sensors can product dispensing be caused to occur again.

A still further means by which misuse of a dispenser by repeated withdrawing of towels unnecessarily can be prevented is by arranging, in addition or even as an alternative to the above moving average, an adjustable minimum elapsed time between towel dispensing (e.g. a time of between 2 and 10 seconds). However, this feature is not generally required since in most cases, the inherent elapsed time for the system to determine a user as being present in the dispensing zone and to turn the motor to dispense a towel, will be sufficient to prevent such misuse.

It will also be appreciated that as the batteries of the dispenser discharge over time, the power supplied to the sensors may also be affected, which may cause less efficient operation. To prevent this from occurring, and thus to ensure a stable voltage is available for supply to the sensors (until a time close to total battery depletion), a constant current sink may be employed. Such constant current sinks to provide voltage stability are well known per se in the art of electronics, and thus are deemed to require no further description here, although it will be understood that their use in the sensing circuitry for such a dispenser as described herein is particularly advantageous. The amount of extra energy required to operate the constant current sink is negligible, and thus use of such a device is barely noticeable on battery useable lifetime.

The power supplied to the emitters may additionally be arranged to be varied by an automatic control, suitably between an amount of 0.001 mAs to 0.1 mAs (when using a 6V battery installation), in order to take account of reflected signal strength from previous scans and to adjust the level of emitted IR to a more suitable level.

This can be achieved by varying the current to the emitters between e.g. 1 mA and 100 mA (i.e. a 100-times variation possibility). This can be done by using the PWM module 106 (to be described later) whereby a square PWM signal is converted to a DC voltage having an output proportional to the PWM duty cycle, and whereby the MCU changes the PWM duty cycle to adjust the DC voltage to the emitter circuits, and thus the power of the IR signal emitted, based on signal strength inputs received by the sensors and sent to the MCU. For example, if the reflected signal strength is very low on the last few scans (e.g. five scans) when dispensing occurred, this may be because the typical brightness of the user's hands is low and background light levels are relatively high. This may cause received signal levels to be only just above the predetermined level compared to background IR unless the user's hands are placed very close to the sensors, which can lead to difficulty in detection in some circumstances. In such a case, it may be suitable to increase the power supplied to the IR emitters so as to receive a more easily perceptible signal change. Likewise, if the typical brightness of the user's hands is high and background IR levels are low, it may be suitable to decrease the power supplied to the IR emitters as an easily perceivable signal level change (i.e. reflected IR level during dispensing compared to background IR level) is received. In this way, the power supplied to the emitters is still further optimized to take account of such conditions while providing reliable and fast sensing and dispensing. Thus, apart from in very high light conditions, only very low power to the sensors can be used. In this way, it will also be understood that the dispenser can be optimized such that the first detection zone in which the presence of a possible user causes changing from the first to the second scanning rate is selected to lie at between about 20 and 60 cm, preferably between 25 cm and 50 cm from the discharge outlet. It will be apparent that further increases in power to the emitters will increase the range of detection, but the power consumption will increase at a much greater rate and false detections may also occur more easily. Thus the range of up to 50 cm from the dispenser for allowing detection of a user is a preferred maximum.

An alternative, possibly simpler, method which can be used to vary the IR emitter current, rather than by comparing (as above) the values of reflection to background levels, is to set a so-called "standard value" or "threshold value" in the control circuitry, which is a value of the expected detected signal strength received in normal operating conditions. The current supplied might be e.g. 5 mA. If this standard value is called A1, then during operation the control circuitry (MCU thereof) can be made to calculate the IR level, A2, from a predetermined number of the most recently received IR values (i.e. the moving average of the most recent values). If A2>A1 (i.e. the detected reflection moving average signal level A2 is above the stored standard signal level A1) the current supplied to the emitter can be reduced, preferably in increments. Likewise, in the case where A2>A1, then the current supplied to the emitters can be increased, preferably incrementally.

In a further preferred embodiment, the dispenser can be arranged to have two modes of operation, one being the sensing mode described previously whereby active IR sensing is operating, the other being a hanging towel mode whereby each time for example a paper towel is dispensed and also removed (e.g. torn off), a new paper towel is discharged from the dispenser. For this purpose, the cutting edge 16 as shown in FIG. 2 for example could be mounted such that the application of pressure against the cutting edge (often referred to as a cutter bar) causes a switch to be actuated to start the motor M to issue a new piece of towel ready to be torn off. The device may also include a manual switch so that this hanging towel mode can be set manually by a user, or automatically by a timing circuit, for example at known time periods when the dispenser will normally be in constant use and the use of the active IR sensor system is temporarily superfluous.

A hanging towel mode can also for example be suitable in extremely high background IR conditions when the sensing system is totally saturated, and thus cannot detect the difference in the increased level of IR radiation from a user compared to background levels, or at times close to battery depletion when the power consumption of the active IR sensing system is unsuitably high for the remaining power. An automatic switching to this mode and turning off the active IR sensing in times of very high background IR (e.g. at or above 10000 lux) and battery depletion may thus also have advantages.

Figure 6:
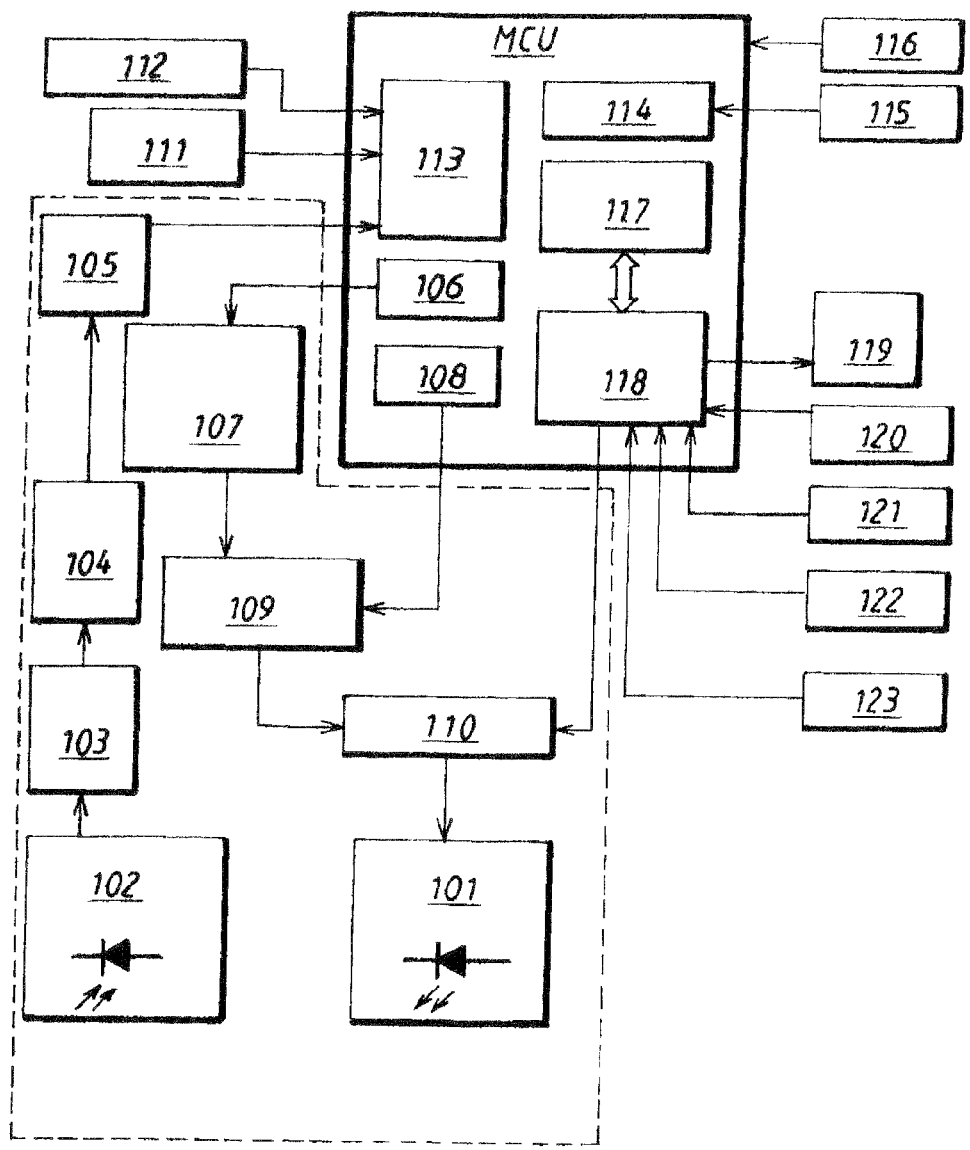
FIG. 6 shows a block diagram of the basic system elements of an embodiment of a dispenser according to the invention.

FIG. 6 shows a block diagram of the basic system of one embodiment of a dispenser according to the invention, in which the portion shown in dotted lines includes the basic components for IR signal modulation, IR emission and IR reception used to submit a sensing signal to the A/D modulation of the master control unit (MCU) which unit contains a microprocessor.

Box 101 and 102 denote IR emitter(s) and receiver(s) respectively, corresponding generally to the previously described emitters 10, 12 and 9, 11, 13. These IR emitters and receivers are preferably photodiodes The user's hand shown outside the dotted lines indicates that IR radiation emitted by the emitter(s) 101 Is being reflected by the hand back to receiver(s) 102. Unit 103 is a photoelectric converter for converting the received IR signal before it is passed to filtering and amplification unit 104 where the band pass filter and amplification circuits operate to amplify the received signal around the central frequency in a limited band width and to thereby suppress other IR frequencies relatively. The signal is then passed to a signal rectification unit 105, since the IR signal is an AC signal. From the unit 105, the signal passes into the A/D module 113 of the MCU.

For IR signal emission, an analogue pulse width module 106 is used to control the power of the IR emission. The output of the PWM module 106 is controlled by the MCU such that a square wave signal from the PWM can have its duty cycle varied by the MCU to adjust the DC voltage to the emitter circuits and thus the power of the IR signal emitted. The PWM 106 is connected to a D/A converter 107 and into an IR emitter driving circuitry unit 109 which includes the constant current sink mentioned previously. Into the same IR emitter driving circuitry is also fed a signal from a phase frequency detection module 108 which issues a 15 kHz (±0.5%) impulse modulated signal (or another frequency of modulated signal as considered appropriate) so as to drive the emitters 101 via the emitter driving circuitry 109 to emit modulated IR signals for short intervals (e.g. each signal is emitted for about 1 ms). In this regard it should be noted that before the modulated signal is emitted, the MCU should first have already put the filter and amplification circuit unit 104 for the received signal into operation for a short period, e.g. 2.5 ms, before emitting a modulated pulse, so as to allow the receiver circuit to stabilize so as to reliably detect reflected IR from the emitted IR signal. Since the unit 104 is already in operation when the IR scanning pulse is emitted and since the filters and amplification unit are centered around the central frequency of the emitted pulse, there is no need to synchronize the timing of the emitted pulse and the received pulse to any further extent.

The signal from unit 109 feeds into the IR emitter on/off control unit 110. The input/output module 118 of the MCU also feeds into the unit 110 to be turned on and off as required to thereby perform an IR scan via the emitter 101.

In order to activate the microprocessor (i.e. wake it up to perform a scan at a certain rate), RC wake-up circuitry 115 feeds into the MCU into a wake-up detection unit 114. Unit 117 is an external interrupt detection unit.

From the input/output module 118 is a feed to unit 119 which can be regarded as the motor driving circuitry which drives the motor M when the sensor system (which preferably includes the MCU and software) has detected that a product should be dispensed due to the determination of the presence of a user in the dispensing zone.

Further peripheral units 111, 112 are respectively a paper sensing circuit unit and a low power detection circuit (i.e. for detecting batteries close to depletion) input to the A/D module 113 of the MCU. Unit 116 indicates battery power which is used to drive the MCU and also all other peripherals and the motor. Unit 120 may he motor overload circuitry which cuts off power to the motor for example when paper becomes jammed in the dispenser or when there is no paper in the dispenser. Unit 121 is a paper length control unit, which operates such that a constant length of paper (which is itself variably adjustable by manual operation e.g. of a variable resistor or the like) each time the motor is made to operate to dispense a length of paper sheet 7 through the discharge opening 3. This unit 121 may also include a low power compensation module by which the motor under lower power is made to turn for a longer period of time in order to dispense the same length of paper sheet, although the unit may simply be a pulse position control system, whereby the rotation of the motor is counted in a series of pulses and the rotation is stopped only when the exact number of pulses has been achieved. Such a pulse position control system could include for example a fixedly located photointerruptor, which can detect slots in a corresponding slotted unit fixed to the motor drive shaft (or alternatively on the drive roller 5 operably connected to the drive motor) . Unit 122 may be low paper detection circuitry and unit 123 may be a unit used to indicate whether the casing is open or closed. This can for example be used to provide automatic feeding of a first portion of paper from the paper roll through the discharge opening when the case is closed, e.g. after refilling with a new roll of paper, so that the person refilling the dispenser is assured that the device is dispensing properly after having been closed.

Although not shown here, a series of warning or status indication lights may be associated for example with various units such as units 111, 112, 120 to 123 to indicate particular conditions to a potential user, dispenser attendant or repairman (e.g. if the dispenser motor is jammed or the dispenser needs refilling with paper or the like).

Figure 7:
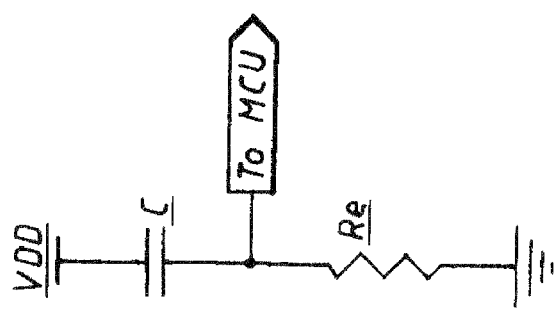
FIG. 7 shows an RC circuit used for effecting wake-up of the microprocessor in the MCU so as to perform a scan.

FIG. 7 shows one embodiment of an RC control circuitry which can be used to give a timed wake-up of the microprocessor in the MCU. The principle of such a circuit is well known and in the present case, a suitable value for the resistor Re is 820 kOhm and for the capacitor 0.33 microfarads. Although not shown specifically in FIG. 6, the RC wake-up circuitry uses the input/output unit 118 of the MCU to provide the timed wake-up function of the microprocessor so that a scan occurs at the prescribed time interval (t1, t2 or t3 for example). When there is a high to low voltage drop at the input/output, as a result of the RC circuitry, the MCU will "wake-up" and perform a scan. This wake-up leading to the performing of a scan also requires supporting software. Likewise, the length of the time t1 and/or t2 and/or t3 can suitably be made as a multiple of the RC circuitry time constant, whereby the input from the RC circuit can be used in the software to determine whether a scan is required or not at each interval. In this regard, it will be noted that an RC circuit is subject to voltage changes at the input (via VDD which is the MCU supply voltage source acquired after passing through a diode from the battery voltage supply). As the voltage of the battery (or batteries) drops, there will then be an increase in the RC time constant in the circuit of FIG. 7, and thus the times t1, t2 and t3 set initially will vary as the batteries become more depleted. For example, with the time t1 set at the preferred level of 0.17 seconds for a battery level of 6V, a drop to depletion level of 4.2V will increase time t1 to 0.22 s. Thus, the values of t1, t2, t3 etc., as used herein, are to be understood as being the values with a fully charged battery source.

Figure 8:
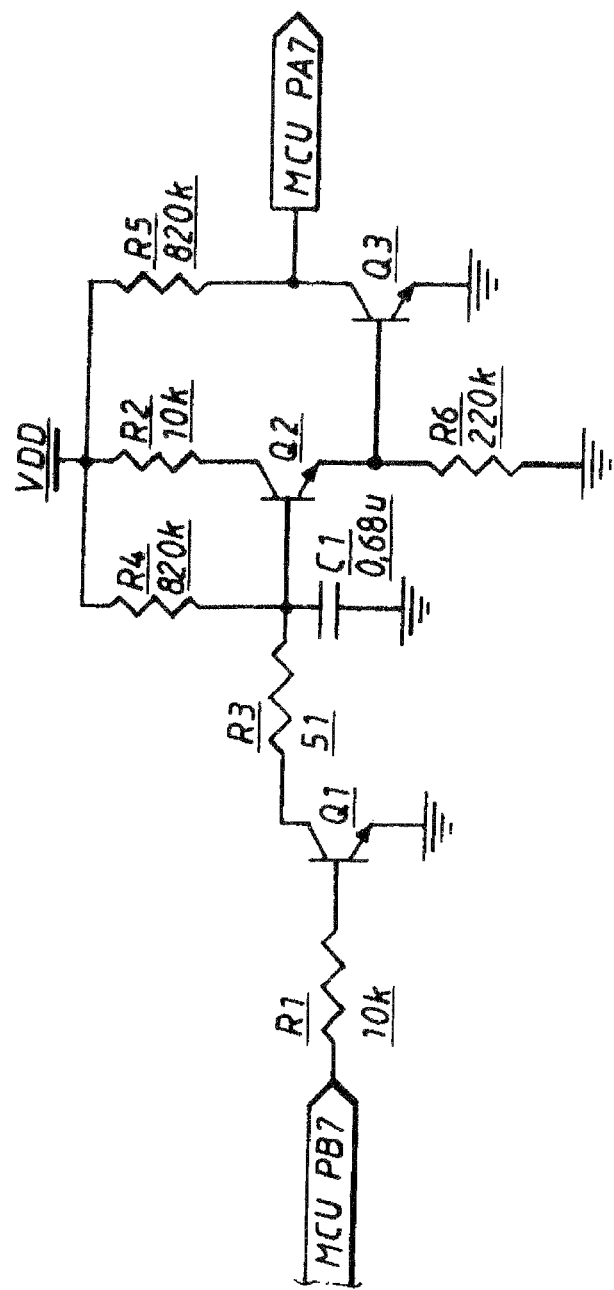
FIG. 8 shows an alternative version of the RC circuit depicted in FIG. 7.

FIG. 8 shows a modified RC circuit which has the advantage of using less current than the circuit shown in FIG. 7. In FIG. 8, three bipolar transistors are used to minimize the current used when the MCU is asleep.

Under normal conditions, the digital circuitry inside the MCU operates in a logic High voltage state and a logic Low voltage state at which the current drain is very low. However when the RS-wake-up circuitry is connected as in FIG. 7 (whereby the indication "to MCU" implies a connection to the input/output port of the MCU) this creates a voltage change at the input/output port of the MCU which is a progressive voltage change, due to the charging and discharging process in the RC circuit. This creates a relatively long working period for the digital circuitry in the MCU, in turn resulting in an internally higher current consumption in the IC internal circuitry than is present during normal operation conditions. This results in somewhat higher power consumption to the MCU during its "off" cycle (i.e. the "sleep" cycle of the MCU).

By the circuitry in FIG. 8, the modification includes the use of two input/output ports PA7 (right hand side in the Figure) and PB7 (left hand side in the Figure) to the MCU. The important aspect of this circuit is that two transistors Q2 and Q3 have been added in cascade which together modify the RC charge-up characteristics. The MCU PA7 pin then gives a much sharper charge-up curve. The delay time constant for waking up the MCU is determined by R4 and C1, which have been given values of 820 kOhm and 0.68 µF respectively in the example shown. Other values for other time constants can of course be chosen.

The fast voltage change at port PA7 is achieved after conversion in Q2 and Q3, which minimizes the time required for transition from a logic High voltage to a logic Low voltage level. Such a circuit as in FIG. 8 can achieve about 40% power reduction during the sleep cycle compared to the FIG. 7 circuitry for approximately the same RC time constants. Thus, the RC timing circuitry of FIG. 8 is particularly advantageous where maximum power is to be saved.

The invention claimed is:

1. A dispenser for automatically dispensing a product stored in a product supply of said dispenser, said dispenser comprising:
a sensor system for detecting the presence of a possible user to whom said product may be dispensed, wherein said sensor system is arranged to scan for the presence of a possible user at a first scanning rate, a second scanning rate and a third scanning rate, and wherein said second scanning rate is higher than said first scanning rate and said third scanning rate is lower than said first scanning rate, and wherein the sensor system is arranged to change said scanning rate from said first scanning rate to said second scanning rate when a possible user is determined as having been detected by said sensor system to be within a first detection zone, and said sensor system being arranged to change said scanning rate to said third scanning rate, when the sensor system has not detected the presence of a possible user for a predetermined time period.

2. The dispenser according to claim 1, wherein said first detection zone includes an area which is located a further distance away from the dispenser than a dispensing zone, and wherein the sensor system is arranged such that a possible user determined by the sensor system as having entered the dispensing zone causes said dispenser to dispense said product.

3. The dispenser according to claim 1, wherein said dispenser is a paper dispenser.

4. The dispenser according to claim 1, wherein said product supply includes a supply of non-perforated paper, and wherein said dispenser comprises a discharge outlet with a cutting edge located proximate said discharge outlet and against which cutting edge said paper may be moved relatively, so as to cut said paper for removing a cut-away portion.

5. The dispenser according to claim 4, wherein said dispenser includes a housing comprising said discharge outlet.

6. The dispenser according to claim 1, wherein said dispenser is a paper hand-towel dispenser, and wherein said product supply is in the form of a continuous sheet of paper.

7. The dispenser according to claim 1, wherein the sensor system comprises infrared sensors, including at least one infrared emitter and at least one infrared receiver arranged at a discharge outlet of said dispenser.

8. The dispenser according to claim 7, wherein the sensor system comprises at least two infrared emitters and at least three infrared receivers for detecting presence of a possible user.

9. The dispenser according to claim 8, wherein in a lateral direction of the dispenser discharge outlet, the receivers and emitters are arranged consecutively as receiver/emitter/receiver/emitter/receiver.

10. The dispenser according to claim 1, wherein the first scanning rate is a rate of between 0.15 to 1.0 seconds between single scans, and said second scan rate is a rate of between 0.05 to 0.2 seconds between single scans.

11. The dispenser according to claim 1, wherein the first scanning rate is a rate of 0.15 to 0.4 seconds between single scans, and the second scanning rate is a rate of 0.05 to 0.15 seconds between single scans.

12. The dispenser according to claim 1, wherein said predetermined time period is a time of at least 60 seconds.

13. The dispenser according to claim 1, wherein said sensor system comprises a further sensor arrangement including at least one emitter and one receiver arranged to detect the presence of a possible user at a distance of more than 50 cm.

14. The dispenser according to claim 13, wherein said sensor arrangement is located in the dispenser at an external surface thereof, so as to face forwardly and outwardly on an outwardly facing frontal portion of said dispenser so that portions of at least the emitters of the sensor arrangement project externally from said dispenser.

15. The dispenser according to claim 13, wherein said further sensor arrangement is arranged at a location remote to said dispenser and operably connected to said dispenser sensing system by means of a wire link or a wireless link.

16. The dispenser according to claim 1, wherein said sensor system includes a control system arranged to detect a possible user in dependence upon signal strength of received infrared emissions, such that a possible user is determined to have entered said first zone when said sensor system detects a change in received signal strength which is greater than a predetermined amount above another signal strength level, said change in said received signal strength level being a predetermined signal strength level above a background signal strength level.

17. The dispenser according to claim 16, wherein a possible user is determined to have entered a dispensing zone when said sensor system is operating at said second scanning rate and when said control circuitry detects a signal strength greater than a predetermined signal strength level compared to background signal strength level for a predetermined number of single scans at said second scanning rate, thereby causing said dispenser to dispense a product.

18. The dispenser according to claim 16, wherein said predetermined signal strength level is 10% higher than background level.

19. The dispenser according to claim 16, wherein said predetermined number of single scans at said second scanning rate is between one and five scans.

20. The dispenser according to claim 16, wherein said control system is arranged to regard a user as having entered the dispensing zone when the received signal strength in one single scan at either the first or second scanning rates is 30% or more greater than the background signal level.

21. The dispenser according to claim 1, wherein said second scanning rate is maintained for a predetermined time period after said control system has caused said dispenser to dispense a product, before reverting back to said first scanning rate.

22. The dispenser according to claim 1, wherein said second scanning rate is maintained for a predetermined number of scans after said control system has caused said dispenser to dispense a product, before reverting back to said first scanning rate.

23. The dispenser according to claim 1, wherein said sensor system changes said second scanning rate back to said first scanning rate immediately after the sensor system has registered that a product is to be dispensed.

24. The dispenser according to claim 1, wherein said sensor system is arranged to emit infrared radiation only with a first limited emitting frequency band and wherein said sensor system is arranged to detect radiation in a limited frequency detection range of between about 2 to 10 kHz bandwidth both above and below said first emitting frequency band.

25. The dispenser according to claim 24, wherein said first emitting frequency is about 15 kHz and said frequency detection range is between about 12 kHz and 18 kHz.

26. The dispenser according to claim 1, wherein said sensor system is an infrared sensor system, wherein the power supplied to one or more emitters of said sensor system is variable, so as to be able to vary the emitted infrared signal strength.

27. The dispenser according to claim 26, wherein the power supplied to said one or more emitters is increased when the average signal level of a predetermined number of the most recently received previous scans is less than at least a first predetermined signal level, and wherein said power supplied is decreased when the average energy level of a predetermined number of the most recently received previous scans is more than said first predetermined signal level.

28. The dispenser according to claim 27, wherein the power supplied to said one or more emitters is determined such that a possible user will cause a change from said first scanning rate to said second scanning rate when said user is located a distance of up to somewhere between 20 and 60 cm from the discharge outlet of said dispenser.

29. The dispenser according to claim 1, wherein said sensor system includes means for detecting background infrared radiation, said means includes a storage of a predetermined number of most recently received infrared detections obtained during scanning, and wherein an average of said predetermined number of most recently received infrared detections is taken as the background infrared radiation level.

30. The dispenser according to claim 1, wherein said dispenser includes a device for adjusting a minimum time between dispensing one product and dispensing the next product.

31. The dispenser according to claim 30, wherein said device for adjusting a minimum time between dispensing one product and the next product can be set to zero, such that the time between dispensing one product and the next is determined by a minimum reset time inherent in the system.

32. The dispenser according to claim 1, wherein the dispenser and sensor system are battery powered, by a battery located in the dispenser housing.

33. The dispenser according to claim 1, wherein at least the first scanning rate is set by an RC timing circuit operating together with software controlled by a microprocessor, wherein said microprocessor is woken up by said RC timing circuit supplying a current to an input of the microprocessor at the end of each RC time constant, and which causes said microprocessor to be inactive between scans.

34. The dispenser according to claim 33, wherein the RC timing circuit includes three bipolar transistors, two being in cascade, and two connections to an input/output section of said microprocessor.

* * * * *